Feb. 25, 1964 S. T. HUEY 3,122,647
PULSE LENGTH DISCRIMINATOR UTILIZING TWO GATING CIRCUITS
Filed Aug. 29, 1960 4 Sheets-Sheet 1

INVENTOR.
SAMUEL T. HUEY
BY Edward J. Norton
ATTORNEY

INVENTOR.
SAMUEL T. HUEY
BY Edward J. Norton
ATTORNEY

Feb. 25, 1964 S. T. HUEY 3,122,647

PULSE LENGTH DISCRIMINATOR UTILIZING TWO GATING CIRCUITS

Filed Aug. 29, 1960 4 Sheets-Sheet 3

INVENTOR.
SAMUEL T. HUEY
BY Edward J. Norton
ATTORNEY

Feb. 25, 1964 S. T. HUEY 3,122,647

PULSE LENGTH DISCRIMINATOR UTILIZING TWO GATING CIRCUITS

Filed Aug. 29, 1960 4 Sheets-Sheet 4

INVENTOR.
SAMUEL T. HUEY
BY Edward J. Norton
ATTORNEY

United States Patent Office 3,122,647
Patented Feb. 25, 1964

3,122,647

PULSE LENGTH DISCRIMINATOR UTILIZING TWO GATING CIRCUITS

Samuel Todd Huey, Dorval, Quebec, Canada, assignor to Radio Corporation of America, a corporation of Delaware Filed Aug. 29, 1960, Ser. No. 52,556
15 Claims. (Cl. 307—88.5)

This invention relates to pulse length discriminators. Particularly, the invention relates to a circuit arrangement capable of discriminating between input pulses of different length and providing in synchronism with each input pulse an output pulse whose characteristics are determined by the length of the input pulse.

There are many applications in which it is desirable to forward information by varying the length of successive pulses appearing over a transmission path. For example, in telemetering, one may wish to perform various operations at a remote location. Each operation to be performed is assigned a particular pulse length. Equipment must be provided at the remote location which discriminates between the received pulses of different length, and, upon determining the length of a received pulse, provides an output for completing the operation assigned to that pulse length.

Equipments presently available for performing pulse length discrimination generally employ pulse counting methods or integration of incoming pulse lengths. Such methods entail the troublesome problem of electronically resetting the equipment after each operating cycle thereof, and so on.

It is an object of the invention to provide an improved pulse length discriminator.

Another object is to provide an improved pulse length discriminator for producing output pulses in synchronism with the received input pulses, the characteristics of the output pulses being determined by the length of the input pulses.

A further object is to provide an improved pulse length discriminator having an output of reduced sensitivity to noise.

A still further object is to provide an improved pulse length discriminator particularly suitable for use in applications where light weight and compactness are desirable.

A still further object is to provide an improved pulse length discriminator which is simple and reliable in operation and requires a minimum number of components.

The objects of the invention are accomplished by a circuit arrangement including a combination of AND gating circuits and one or more monostable multivibrators. For present purposes, an AND gate or gating circuit is defined as one which produces an output only upon the presence of two or more input signals of given amplitude and polarity applied to the gate. The monostable multivibrators and AND gates are combined so that the leading edge of any input pulse initiates the examination of the existence of the end of that pulse within time limits determined by the unstable or active period of one or more of the multivibrators.

In one embodiment of the invention arranged to provide a first or a second output according to an input pulse length, the input pulses are applied simultaneously to a monostable multivibrator and to a first and a second AND gate. Upon the reception of the leading edge of an input pulse, the monostable multivibrator is shifted from its inactive or stable state to its active or unstable state. Following a given time interval, the multivibrator automatically and without further triggering shifts back to its inactive or stable state. One of the AND gates coupled to the multivibrator is arranged to produce an output pulse only when an input pulse applied to the gate terminates prior to the time at which the multivibrator, shifted to its active state by that input pulse, shifts back to its inactive state. The leading edge of the output pulse occurs simultaneously with the trailing edge of the input pulse, the length of the output pulse corresponding to the time interval by which the active period of the multivibrator exceeds the input pulse length.

The remaining AND gate is coupled to the multivibrator and arranged to produce an output pulse only when an input pulse applied thereto terminates after the time at which the multivibrator, shifted to its active state by that input pulse, shifts back to its inactive state. The trailing edge of the output pulse produced by the AND gate occurs simultaneously with the trailing edge of the input pulse, the length of the output pulse corresponding to the time interval by which the input pulse length exceeds the active period of the multivibrator. Therefore, one of the AND gates produces an output pulse for each input pulse having a length less than the active period of the multivibrator. The remaining AND gate produces an output pulse for each input pulse having a length greater than the active period of the multivibrator. The time constants of the multivibrator are determined so that the reception of input pulses having a length less than a given length results in an output pulse from one AND gate and the reception of input pulses having a length greater than the given length results in an output pulse from the other AND gate, according to the needs of the particular application.

Additional embodiments of the invention incorporating the above principles and providing three or more separate outputs will be described.

A more detailed description of the invention will now be given in connection with the accompanying drawing which forms a part of this specification and in which.

Figures 1, 2:
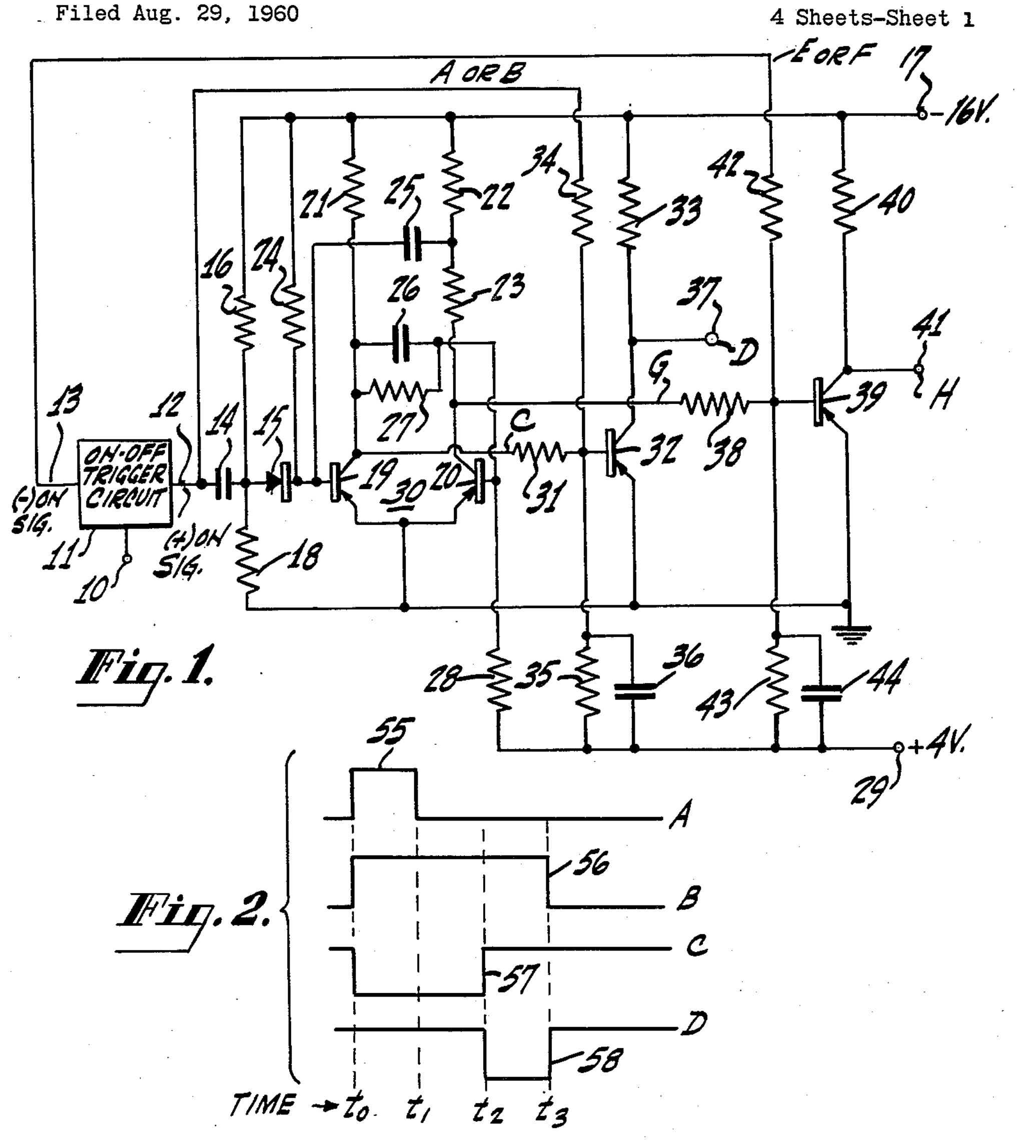
FIGURE 1 is a circuit diagram of one embodiment of the invention.
FIGURES 2 and 3 are groups of waveforms used in describing the operation of the embodiment illustrated in FIGURE 1.

In the embodiment of the invention shown in FIGURE 1, a signal in which information is forwarded by causing the signal to be on or above a given level for varying lengths of time is applied via an input terminal 10 to an on-off trigger circuit 11. The trigger circuit 11 is of a conventional type which remains in one stable state during the periods in which the incoming signal is off or at a level less than that required to trigger the circuit 11. When the incoming signal assumes the on condition by rising above the level necessary to trigger the circuit 11, the circuit 11 assumes a second stable state and remains in the second stable state while the incoming signal is in the on condition. When the level of the incoming signal drops below the level necessary to trigger the circuit 11, that is the signal assumes the off condition, the trigger circuit 11 returns to the first stable state, and so on. First and second outputs of opposite polarities are available from the circuit 11. When the circuit 11 is in the first stable state, the first output is of one polarity and the second is of the opposite polarity. In the second stable state of the circuit 11, the polarity of each of the two outputs is reversed. One example of such a circuit is the so called Schmitt trigger circuit. Since many examples of trigger circuits capable of performing the above operation are known, a more detailed description thereof is believed to be unnecessary for present purposes.

In describing the invention, it will be assumed that the right hand output 12 of the trigger circuit 11 is negative going at a peak value, for example, of −16 v., during the periods in which the circuit 11 is in its first stable state and becomes positive going at a peak value, for example, of −.2 v., upon the circuit 11 assuming its second stable state. The left hand output 13 of the circuit 11 is positive going at a peak value of −.2 v. during the periods in which the circuit 11 is in its first stable state and becomes negative going at a peak value of −16 v. upon the circuit assuming its second stable state. By a positive pulse or by a positive going pulse is meant a pulse going in a positive direction relative to a reference voltage level not necessarily zero volts. By a negative pulse or by a negative going pulse is meant a pulse going in a negative direction relative to the reference voltage level not necessarily zero volts.

The right hand output 12 of the trigger circuit 11 is coupled through a capacitor 14 to the anode of a crystal diode 15, the arrow indicating the direction of current flow through the diode 15. The junction of capacitor 14 and diode 15 is connected through a resistor 16 to the negative terminal 17 of a source of unidirectional potential, for example, at −16 v. A resistor 18 is connected from the junction of capacitor 14 and diode 15 to a point of reference potential shown as ground. Capacitor 14, and resistors 16 and 18 function as a differentiating circuit and also serve to supply a reverse bias to diode 15. The diode 15 is held non-conducting in the absence of a positive going pulse applied to the anode thereof via the capacitor 14.

The cathode of diode 15 is coupled to the base electrode of a PNP junction transistor 19. The emitter electrode of transistor 19 is connected to the emitter electrode of a second PNP junction transistor 20 and to the point of reference potential. The collector electrode of transistor 19 is connected through a resistor 21 to the negative terminal 17, while the collector electrode of the transistor 20 is connected through resistors 22, 23 to the negative terminal 17. A resistor 24 is connected between the base electrode of transistor 19 and the negative terminal 17. A capacitor 25 is connected between the base electrode of transistor 19 and the junction of resistors 22, 23. The base electrode of transistor 20 is connected through a parallel connected capacitor 26 and resistor 27 to the collector electrode of transistor 19. A bias voltage is applied to the base electrode of transistor 20 through a resistor 28 from the positive terminal 29 of a source of unidirectional potential.

It is clear that transistors 19 and 20 and the associated components are interconnected to form a monostable or one shot multivibrator, indicated generally by the reference numeral 30. In standby condition, the base electrode of transistor 20 is positive with respect to the emitter electrode of transistor 20. Transistor 20 is non-conducting. The base electrode of transistor 19 is negative with respect to the emitter electrode of transistor 19, and transistor 19 is conducting. The multivibrator 30 including transistors 19, 20 is in its stable state. Upon the application of a positive going pulse through the diode 15 to the base electrode of transistor 19, causing the base electrode to become positive with respect to the emitter electrode, transistor 19 becomes non-conducting. The network including capacitor 26 and resistor 27 supplies a negative going voltage to the base electrode of transistor 20, and transistor 20 conducts. The multivibrator 30 is now in its unstable state. The network including capacitor 26 and resistor 27 is largely resistive in nature due to the small value of capacitor 26 and compensates for capacitance at the base electrode of transistor 20, thereby speeding up the time required to shift the state of the multivibrator 30.

Following a time interval determined by the value of resistor 24 and capacitor 25, the base electrode of transistor 19 again becomes negative with respect to the emitter electrode of transistor 19, and transistor 19 conducts. The base electrode of transistor 20 becomes positive with respect to the emitter electrode of transistor 20. Transistor 20 becomes non-conducting. Multivibrator 30 resumes its stable state in which it will remain until triggered by a subsequent positive going pulse supplied to the base electrode of transistor 19 via diode 15. In order to prevent the base electrode of transistor 19 from exceeding a safe peak collector-base voltage when transistor 19 becomes non-conducting, the collector load of transistor 20 is split. Capacitor 25 is connected to the junction of resistors 22, 23 rather than directly to the collector electrode of transistor 20, reducing the reverse bias applied to the transistor 19.

The collector electrode of transistor 19 is connected through a resistor 31 to the base electrode of a PNP junction transistor 32. Transistor 32 includes an emitter electrode connected to the point of reference potential and a collector electrode connected to the negative terminal 17 through a resistor 33. The base electrode of transistor 32 is connected to the right hand output 12 of the trigger circuit 11 through a resistor 34. A bias voltage is applied from the terminal 29 to the base electrode of transistor 32 over a path including resistor 35. A capacitor 36 serves to filter fast transients such as those due to a slight lack of synchronism between the output of circuit 11 and the output of multivibrator 30. An output terminal 37 is connected to the collector electrode of transistor 32. As will become apparent, transistor 32 and its associated components form a first AND gate.

The collector electrode of transistor 20 is connected through a resistor 38 to the base electrode of a PNP transistor 39. The emitter electrode of transistor 39 is connected to the point of reference potential, and the collector electrode of transistor 39 is connected through a resistor 40 to the negative terminal 17. An output terminal 41 is connected to the collector electrode of transistor 39. The base electrode of transistor 39 is connected through a resistor 42 to the left hand output 13 of the trigger circuit 11. A bias voltage is applied to the base electrode of transistor 39 through a resistor 43. Capacitor 44 is similar in function to capacitor 36. The ends of capacitors 36 and 44 shown connected to terminal 29 could equally well be connected to the point of ground or reference potential. As will become apparent, transistor 39 and its associated components form a second AND gate.

When the level of the incoming signal applied to terminal 10 is and remains below that necessary to shift the state of the trigger circuit 11, the trigger circuit 11 is in its stable state in which a negative going or −16 v. output appears at the right hand output 12 and a positive going or −.2 v. output appears at the left hand output 13. Multivibrator 30 is in its stable state in which transistor 19 is conducting and transistor 20 is non-conducting. The negative going voltage at a peak value of −16 v. is applied from the right hand output 12 of trigger circuit 11 to the base electrode of transistor 32 via resistor 34. At the same time, a positive going voltage at a peak value of −.2 v. is applied from the collector electrode of transistor 19, which is conducting, to the base electrode of transistor 32 via resistor 31. The bias voltage supplied to the base electrode of transistor 32 from terminal 29 is overridden, and the base electrode is negative with respect to the emitter electrode of transistor 32. Transistor 32 forming the first AND gate is normally conducting and remains conducting so long as one of the inputs supplied thereto via resistors 31, 34 is negative going at a peak value of −16 v.

In the case of the second AND gate or transistor 39, the positive going output at a peak value of —.2 v. is applied from the left hand output 13 of trigger circuit 11 to the base electrode of transistor 39 through resistor 42. A negative going voltage at a peak value of —16 v. is supplied from the collector electrode of transistor 20, which is now non-conducting, through resistor 38 to the base electrode of transistor 39. The bias voltage supplied to the base electrode of transistor 39 from terminal 29 is overridden, and the base electrode is negative with respect to the emitter electrode of transistor 39. Transistor 39, like transistor 32, is normally conducting and remains conducting so long as one of the inputs supplied thereto via resistors 38, 42 is negative going at a peak value of —16 v.

Figure 3:
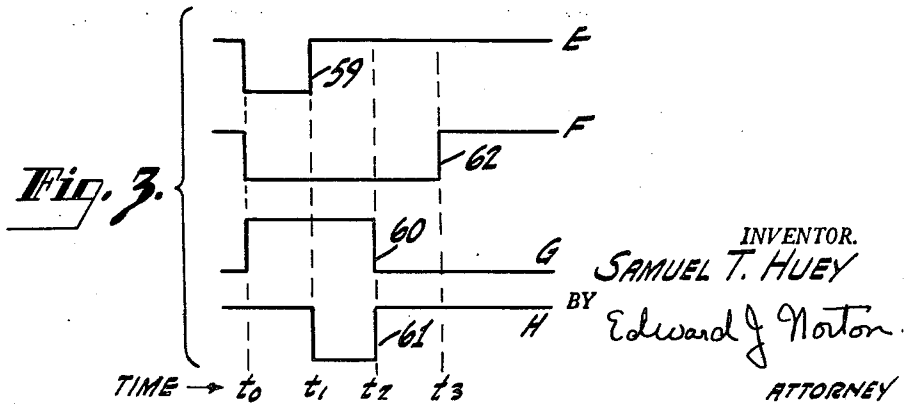

The operation of the embodiment of the invention shown in FIGURE 1 in response to a particular pair of input pulses of different length will now be described with the assistance of the waveforms given in FIGURES 2 and 3. The waveforms of FIGURE 2 depict the operation of the first AND gate, transistor 32, while the waveforms of FIGURE 3 depict the operation of the second AND gate, transistor 39. Turning to the waveforms in FIGURE 2, a first input pulse 55 having a length $t_0$–$t_1$ is shown in waveform A. The second input pulse 56 having a length $t_0$–$t_3$ is shown in waveform B. The first input pulse 55 may be 33 milliseconds in length, while the second input pulse 56 is 100 milliseconds in length. In order to provide an output from one of the AND gates upon the reception of the first input pulse 55 and an output from the other AND gate upon the reception of pulse 56, the values of capacitor 25 and resistor 24 are determined so that the period during which multivibrator 30 remains in its unstable state is longer than the length $t_0$–$t_1$ of pulse 55 but shorter than the length $t_0$–$t_3$ of pulse 56. It will be assumed that multivibrator 30 remains in its unstable state over the period $t_0$–$t_2$, as indicated by the waveform C of FIGURE 2. Multivibrator 30 remains in its unstable state for a period of 66 milliseconds.

It will first be assumed that the signal input to the trigger circuit 11 via terminal 10 rises above the triggering level of circuit 11 for an interval corresponding to the length of pulse 55 or $t_0$–$t_1$. The trigger circuit 11 changes state and the positive going pulse 55 at a peak value of —.2 v. appears at the right hand output 12 of circuit 11. The positive going pulse 55 is differentiated by capacitor 14, resistors 16, 18 and applied to the base electrode of transistor 19 through diode 15. Multivibrator 30 immediately at $t_0$ switches from its stable state to its unstable state with transistor 19 non-conducting and transistor 20 conducting. A negative going voltage pulse 57 at a peak value of —16 v., shown in waveform C of FIGURE 2, is applied from the collector electrode of transistor 19 to the base electrode of transistor 32 through resistor 31. At the same time the positive going pulse 55 at a peak value of —.2 v. is applied from the right hand output 12 of trigger circuit 11 to the base electrode of transistor 32 through resistor 34. An examination of pulses 55 and 57 in FIGURE 2 shows that throughout the duration of the pulse 55, a negative going voltage 57 at a peak value of —16 v. is being applied to the transistor 32 from the multivibrator 30. Transistor 32 remains conducting. At time $t_2$, the multivibrator 30 switches back to its stable state and a positive going (less negative) voltage at a peak value of —.2 v. is applied therefrom to the transistor 32. Since the trailing edge of the pulse 55 occurs at time $t_1$, a negative going voltage at a peak value of —16 v. is applied from the trigger circuit 11 to transistor 32 at time $t_2$. Again, transistor 32 remains conducting. Transistor 32, therefore, produces no output pulse upon the reception of pulse 55. Further, no output pulse will be produced by transistor 32 for any input pulse having a length less than $t_0$–$t_2$ or the unstable period of multivibrator 30, except in the case of a series of pulses of duration less than $t_0$–$t_2$ spaced less than $t_0$–$t_2$ apart with subsequent pulses starting before $t_2$ but continuing after $t_2$.

Upon the application of a signal condition to trigger circuit 11 via terminal 10 corresponding to pulse 56 shown in waveform B of FIGURE 2, the trigger circuit 11 changes state for the duration of the pulse. A positive pulse applied to the base electrode of transistor 19 causes multivibrator 30 to assume its unstable state, and the negative going voltage pulse 57 at —16 v. is applied to the base electrode of transistor 32. At the same time, the positive going pulse 56 at a peak value of —.2 v. is applied from the right hand output 12 of trigger circuit 11 to the base electrode of transistor 32. During the period $t_0$–$t_2$, a negative going voltage at a peak value of —16 v. is applied from the multivibrator 30 to the transistor 32 base electrode. Transistor 32 remains conducting. At time $t_2$, the input to the base electrode of transistor 32 from the multivibrator 30 returns to a positive going (less negative voltage) at a peak value of —.2 v. For the period $t_2$–$t_3$ both inputs to transistor 32 are positive going at a peak value of —.2 v. The level of the bias voltage supplied via terminal 29, and resistor 35, shown as +4 v., is set to ensure that in this condition the base electrode of transistor 32 is sufficiently positive with respect to the emitter electrode to render transistor 32 non-conducting. Transistor 32 remains non-conducting for the period $t_2$–$t_3$ or, in other words, for the remaining duration of the input pulse 56. When the trailing edge of pulse 56 occurs at time $t_3$, the input to the base electrode of transistor 32 from the trigger circuit 11 again becomes negative going at a peak value of —16 v. Transistor 32 becomes conducting. By the above action, the reception of the signal condition corresponding to pulse 56 results in the production of a pulse 58, shown in waveform D of FIGURE 2, at the collector electrode of transistor 32. The output pulse 58 is available at terminal 37 for application to utilization equipment.

The output pulse 58 produced by the first AND gate, transistor 32, has a duration $t_2$–$t_3$ or 33 milliseconds. Transistor 32 produces an output pulse upon the reception by the trigger circuit 11 of any signal condition corresponding to an input pulse having a length greater than the unstable period $t_0$–$t_2$ of the multivibrator 30. The length of the output pulse so produced corresponds to the amount by which the length of the input pulse exceeds the unstable period $t_0$–$t_2$ of the multivibrator 30. A feature of the invention is the fact that, in addition to supplying information as to the length of the input pulse, the output pulse is in a given time relationship or synchronized to the trailing edge of the input pulse 56. The invention is suitable for use where it is desired to synchronously control equipment in response to the output pulses so produced. The output of the transistor 32 is highly insensitive to input pulses due to noise, since no output is produced unless such an input pulse begins prior to the time $t_2$ and continues after the time $t_2$, where $t_2$ is the time measured from a previous pulse trigger applied to multivibrator 30.

In describing the operation of the second AND gate, transistor 39, it will first be assumed that a signal condition corresponding to an input pulse having the length $t_0$–$t_1$ or 33 milliseconds is applied to the trigger circuit 11. Trigger circuit 11 changes state for the duration of the input pulse, and a negative going pulse 59 at a peak value of —16 v., shown in waveform E of FIGURE 3, is applied from the left hand output 13 of trigger circuit 11 to the base electrode of transistor 39. At the same time, a positive going pulse applied through diode 15 to the base electrode of transistor 19 causes multivibrator 30 to assume its unstable state. A positive going voltage pulse 60 at a peak value of —.2 v., shown in waveform G of FIGURE 3, is applied from the collector electrode of transistor 20 to the base electrode of transistor 39. For the duration $t_0$–$t_1$ of the input pulse 59, the base electrode of transistor 39 remains negative with respect to the emitter electrode, and transistor 39 remains conducting.

When the trailing edge of the pulse 59 occurs at time $t_1$, the input to the transistor 39 from the trigger circuit 11 becomes positive going at a peak value of $-.2$ v. For the period $t_1$–$t_2$, both inputs to the transistor 39 are positive going at a peak value of $-.2$ v. The bias voltage applied to the base electrode of transistor 39 via terminal 29 and resistor 42 ensures that in this condition transistor 39 is rendered nonconducting. A negative going output pulse 61 having the time duration $t_1$–$t_2$ or 33 milliseconds, shown in waveform H of FIGURE 3, is produced at the collector electrode of transistor 39. The output pulse 61 is available at terminal 41 for application to utilization equipment. The output pulse 61 is synchronized to the trailing edge of the input pulse 59 and has a length corresponding to the difference between the unstable period of multivibrator 30 and the length of the input pulse.

Upon the reception by the trigger circuit 11 of a signal condition corresponding to an input pulse having the duration $t_0$–$t_3$ or 100 milliseconds, a negative going pulse 62 at a peak value of $-16$ v., shown in waveform F of FIGURE 3, is applied from the left hand output of trigger circuit 11 to the base electrode of transistor 39. At the same time, the multivibrator 30 is shifted into its unstable state and the positive going voltage pulse 60 is applied to the base electrode of transistor 39. During the period $t_0$–$t_3$, a negative going voltage at $-16$ v. is applied to the base electrode of transistor 39 from the trigger circuit 11, and transistor 39 remains conducting. Prior to the time $t_3$ of the trailing edge of the pulse 62, the multivibrator 30 will have returned to its stable state, causing a negative going voltage at a peak value of $-16$ v. to be applied to the base electrode of transistor 39. Transistor 39 remains conducting. Upon the reception of any input pulse having a length greater than the unstable period $t_0$–$t_2$ of the multivibrator 30, transistor 39 remains conducting.

A pulse length discriminator circuit is provided by which one of two possible outputs is produced according to the length of the received input pulse. An output pulse is produced by one AND gate, transistor 32, for all input pulses having a length greater than a predetermined length. When each input pulse having a length less than the predetermined length is received, an output pulse is produced by the second AND gate, transistor 39. Both of the AND gates, transistors 32 and 39, provide output pulses having lengths governed by the lengths of the input pulses and synchronized to the trailing edge of the input pulses, facilitating the synchronous operation of the controlled equipment. Such synchronous operation is not possible using known discriminators with integration of input pulse. Since no counters or similar circuits are employed, no reset triggering is necessary. A fast response time is possible, since the spacing between received, input pulses need be only longer than the unstable period of the multivibrators.

While particular voltage values, time periods and transistor types have been presented, they are given only by way of example. Instead of producing an output pulse only upon a positive going input condition as illustrated, each transistor gate may be arranged to produce an output pulse only upon a negative going input condition by properly applying the inputs to the electrodes of the transistor, employing a different transistor type, and so on. Further, the unstable period of the multivibrator can be readily determined to provide pulse length discrimination as required by a particular application.

A push-pull input has been shown in describing the invention. In practice, the trigger circuit 11 or other push-pull input means may be eliminated by minor circuit changes in the gating circuits.

Figure 4:
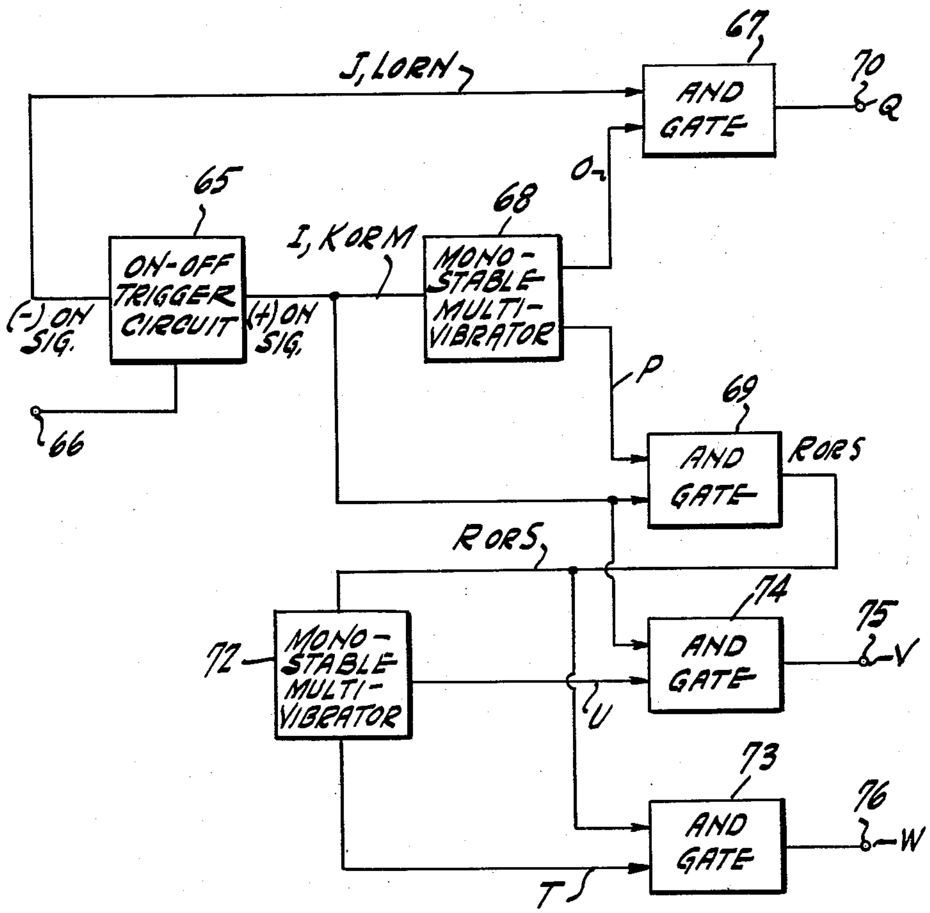
FIGURE 4 is a block diagram of a further embodiment of the invention.

An extension of the invention to an arrangement providing three or more outputs is shown in the block diagram of FIGURE 4. The top half of the diagram is identical to the arrangement shown in FIGURE 1. The extension is accomplished by merely providing two pulse length discriminators of the invention arranged and interconnected in a manner to be described.

The incoming signal is applied to an on-off trigger circuit 65 via an input terminal 66. One side of the trigger circuit 11 is connected to an input of AND gate 67. The other side of the trigger circuit is connected to the monostable multivibrator 68 and to an input of AND gate 69. One side of multivibrator 68 is connected to a second input of AND gate 67. The other side of multivibrator 68 is connected to a second input of AND gate 69. An output terminal 70 is connected to AND gate 67. The output of AND gate 69 is connected to a second monostable multivibrator 72 and to a first input of AND gate 73. The first input to AND gate 69 is connected to a first input of AND gate 74. One side of the multivibrator 72 is connected to a second input of AND gate 74, and the other side of the multivibrator 72 is connected to the second input of AND gate 73. An output terminal 75 is connected to AND gate 74, and an output terminal 76 is connected to AND gate 73.

Figure 5:
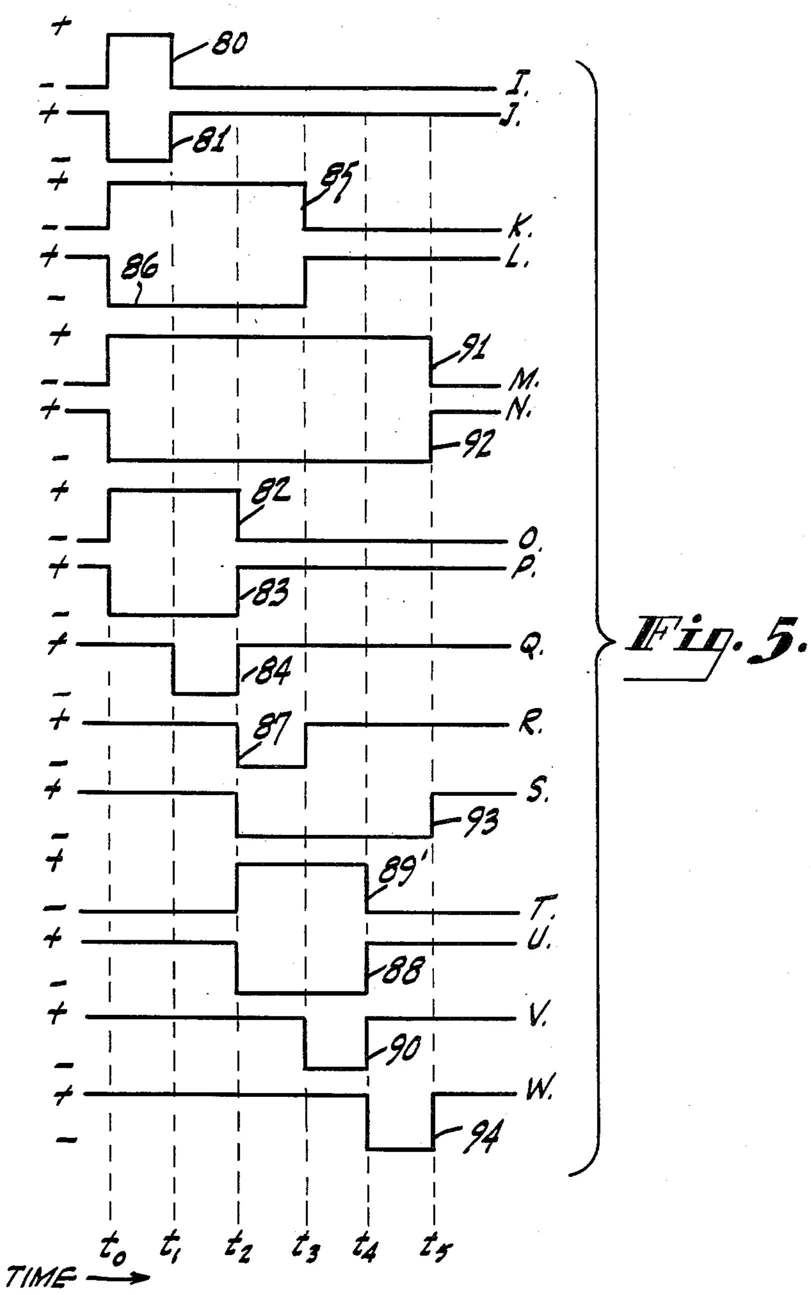
FIGURE 5 is a group of waveforms used in describing the operation of the embodiment shown in FIGURE 4.

The waveforms shown in FIGURE 5 will be referred to in describing the operation of the embodiment given in FIGURE 4. Positive and negative polarity signs are placed adjacent each waveform to aid in understanding the waveforms as the description proceeds. The polarity designations are intended to indicate only that a particular waveform is at a particular moment either positive going or negative going. It is assumed that one output is to be produced for input pulses having a length less than the time period $t_0$–$t_2$. A second output is to be produced for an input pulse having a length greater than the time period $t_0$–$t_2$ but less than the time period $t_0$–$t_4$, and a third output is to be produced for an input pulse having a time period greater than $t_0$–$t_4$.

Upon a signal condition corresponding to an input pulse having the length $t_0$–$t_1$ being applied to trigger circuit 65 via terminal 66, the trigger circuit assumes a state in which a positive going pulse 80 of time $t_0$–$t_1$, shown in waveform I of FIGURE 5, is applied from the right hand side of trigger circuit 65 to multivibrator 68 and to AND gate 69. A negative going pulse 81 of time $t_0$–$t_1$, shown in waveform J of FIGURE 5, is applied from the left hand side of trigger circuit 65 to AND gate 67. Multivibrator 68 is triggered by the leading edge of the received positive going pulse into its unstable period of time duration $t_0$–$t_2$. A positive going pulse 82 of time $t_0$–$t_2$, shown in waveform O of FIGURE 5, is applied from the multivibrator 68 to AND gate 67, and a negative going pulse 83 of time $t_0$–$t_2$, shown in waveform P of FIGURE 5, is applied from the multivibrator 68 to AND gate 69.

Assuming that AND gate 67 produces an output pulse only for a positive going condition on both inputs, a comparison of pulses 81 and 82 shows that this condition does exist for the time period $t_1$–$t_2$. AND gate 67 produces an output pulse 84, shown in waveform Q of FIGURE 5, at terminal 70 having the time duration $t_1$–$t_2$. Clearly, AND gate 67 will produce an output pulse for any input pulse having a length less than the unstable period of multivibrator 68 or $t_0$–$t_2$.

Assuming also that AND gate 69 produces an output pulse only for a positive going condition on both inputs, it may be seen by comparing pulses 80 and 83 that a negative going input condition exists on at least one input to AND gate 69 throughout the period $t_0$–$t_2$ and thereafter. AND gate 69, therefore, produces no output in response to input pulses having a length less than the unstable period $t_0$–$t_2$ of multivibrator 68.

AND gates 73 and 74 are both assumed to produce an output only when both inputs thereto are in a negative going condition. Multivibrator 72 is arranged in its stable condition to apply a negative going condition to AND gate 73 and a positive going condition to AND gate 74. When the positive pulse 89 is applied to AND gate 69, it is also applied to AND gate 74. It may be seen that for the duration of the pulse 89 and thereafter, at least one input to AND gate 74 is in a positive going condition, and no output is produced by AND gate 74. AND gate 69 normally supplies a positive going input condition to AND gate 73. Since no output is produced by AND gate 69 in response to the positive going pulse 80, the input to AND gate 73 from AND gate 69 remains in a positive going condition and no output is produced by AND gate 73. From the above operation, it follows that an output will appear only at terminal 70 for an input pulse to the discriminator having a length less than the unstable period of multivibrator 68 or $t_0$–$t_2$.

Upon the reception by trigger circuit 65 of a signal condition corresponding to an input pulse having a length $t_0$–$t_3$ or greater than the unstable period $t_0$–$t_2$ of multivibrator 68, a positive going pulse 85 of time period $t_0$–$t_3$, shown in waveform K of FIGURE 5, is applied from trigger circuit 65 to multivibrator 68 and to AND gate 69. At the same time a negative going pulse 86 of time period $t_0$–$t_3$, shown in waveform L of FIGURE 5, is applied from trigger circuit 65 to AND gate 67. Multivibrator 68 assumes its condition in which the negative going pulse 83 is applied to AND gate 69 and the positive going pulse 82 is applied to AND gate 67. A comparison of the two inputs 86 and 82 to AND gate 67 shows that at no time are both inputs to AND gate 67 in a positive going condition. No output is produced by AND gate 67 for an input pulse having a length greater than the unstable period $t_0$–$t_2$ of multivibrator 68.

For the period $t_0$–$t_2$, the input to AND gate 69 from the multivibrator 68 is negative going. However, at time $t_2$ the multivibrator 68 returns to its stable state. For the period $t_2$–$t_3$, both inputs to AND gate 69 are in a positive going condition, and AND gate 69 produces an output pulse 87 of time period $t_2$–$t_3$, shown in waveform R of FIGURE 5. The pulse 87 is applied to multivibrator 72 and to AND gate 73. On the leading edge of pulse 87, multivibrator 72 is triggered into its unstable state which is assumed to be equal in duration to that of multivibrator 68. In its unstable condition, multivibrator 72 supplies the negative going pulse 88 of time $t_2$–$t_4$, shown in waveform U of FIGURE 5, to AND gate 74 and the positive going pulse 89 of time $t_2$–$t_4$, shown in waveform T of FIGURE 5, to AND gate 73.

A comparison at this time of the inputs to AND gate 73, namely, pulses 87 and 89, shows that at least one input to AND gate 73 is positive going at all times. No output is produced by AND gate 73. At time $t_3$, the input pulse 85 to AND gate 74 from trigger circuit 65 terminates, and a negative going input condition is applied to AND gate 74 from trigger circuit 65. From time $t_3$–$t_4$ a negative input pulse 88 is also being applied to AND gate 74 from multivibrator 72. AND gate 74 produces an output pulse 90 of time $t_3$–$t_4$, shown in waveform V of FIGURE 5. Upon the reception of an input pulse by the discriminator having a length exceeding the unstable period of multivibrator 68 with a trailing edge occurring prior to the end of the unstable period of multivibrator 72, an output is produced by AND gates 69 and 74. The output of AND gate 74 is available at terminal 75 for application to a utilization circuit. The length of the output pulse so produced is determined by the time elapsing between the trailing edge of the input pulse and the end of the unstable period of multivibrator 72.

With a signal condition applied to trigger circuit 65 corresponding to an input pulse of duration $t_0$–$t_5$, the positive going pulse 91 of duration $t_0$–$t_5$, shown in wavefrom M of FIGURE 5, is applied from trigger circuit 65 to multivibrator 68 and AND gates 69, 74. A negative going pulse 92 of duration $t_0$–$t_5$, shown in waveform N of FIGURE 5, is applied to AND gate 67. Multivibrator 68 is triggered into its unstable state with the positive going pulse 82 applied to AND gate 67 and the negative going pulse 83 applied to AND gate 69. Comparing the inputs 92 and 82 to AND gate 67, it is apparent that at least one input is negative going at all times. AND gate 67 produces no output.

At time $t_2$ the multivibrator 68 resumes its stable state. Comparing inputs 83 and 91 to AND gate 69 shows that for the period $t_2$–$t_5$ both inputs to AND gate 69 are in a positive going condition. AND gate 69 therefore produces an output pulse 93 of time period $t_2$–$t_5$, shown in waveform S of FIGURE 5. The leading edge of pulse 93 triggers multivibrator 72 into its unstable state so that the positive going pulse 89 is applied therefrom to AND gate 73 and the negative going pulse 88 is applied therefrom to AND gate 74.

Comparing the pulse inputs 91 and 88 to AND gate 74, there is no time at which both inputs to AND gate 74 are negative going. Since both inputs to AND gate 74 must be negative going to provide an output therefrom, no output is produced. In the case of AND gate 73, at time $t_4$ multivibrator 72 returns to its stable condition. As shown by inputs 89 and 93 to AND gate 73, during the period $t_4$ to $t_5$ both inputs to AND gate 73 are negative going. AND gate 73 then produces at terminal 76 an output pulse 94 of time period $t_4$–$t_5$, shown in waveform W of FIGURE 5. AND gate 73 produces an output upon the reception of an input pulse by the discriminator having a length greater than the unstable periods $t_0$–$t_4$ of multivibrators 68 and 72.

To review, AND gate 67 produces an output at terminal 70 when an input pulse is received by the discriminator of a length less than the unstable period of multivibrator 68 or $t_0$–$t_2$. The length of the output so produced corresponds to the time differential between the trailing edge of the input pulse and the end of the unstable period of multivibrator 68 or $t_2$. AND gate 74 produces an output at terminal 75 for each input pulse having a length greater than the unstable period $t_0$–$t_2$ of multivibrator 68 but less than the combined unstable periods $t_0$–$t_4$ of multivibrators 68 and 72. Again the output pulse at terminal 75 has a length equal to the time differential between the trailing edge of the input pulse and the end of the unstable period of multivibrator 72. An output appears at terminal 76 from AND gate 73 for each input pulse having a length greater than the combined unstable periods of the multivibrators 68 and 72, the length of the output pulse being equal to the amount by which the pulse exceeds the end of the unstable period of multivibrator 72 or $t_4$. In each case, the output pulse produced is synchronized to the trailing edge of the input pulse.

While no output terminal is shown connected to AND gate 69, it is clear that an output may be taken from this AND gate, if desired, for application to a utilization circuit. As indicated in the waveforms R and S of FIGURE 5, an output is available for each input pulse having a length greater than the unstable period of multivibrator 68.

Pulse length discriminator circuits having more than three outputs can be provided by merely adding the necessary number of stages including a monostable multivibrator and AND gates. A push-pull input, as shown in FIGURE 4, is not required. The AND gates and monostable multivibrators may be arranged to accommodate the input available, and to provide outputs of the desired polarity and characteristics. While AND gates responsive to particular input conditions are shown in FIGURE 4, the invention is clearly not limited to this arrangement. The AND gates may be arranged to respond to input pulses as dictated by the needs of the application. The discriminating action by which outputs are provided at the various output terminals can be determined by the proper setting of the active or unstable periods of the multivibrators according to the requirements of the particular application.

Figure 6:
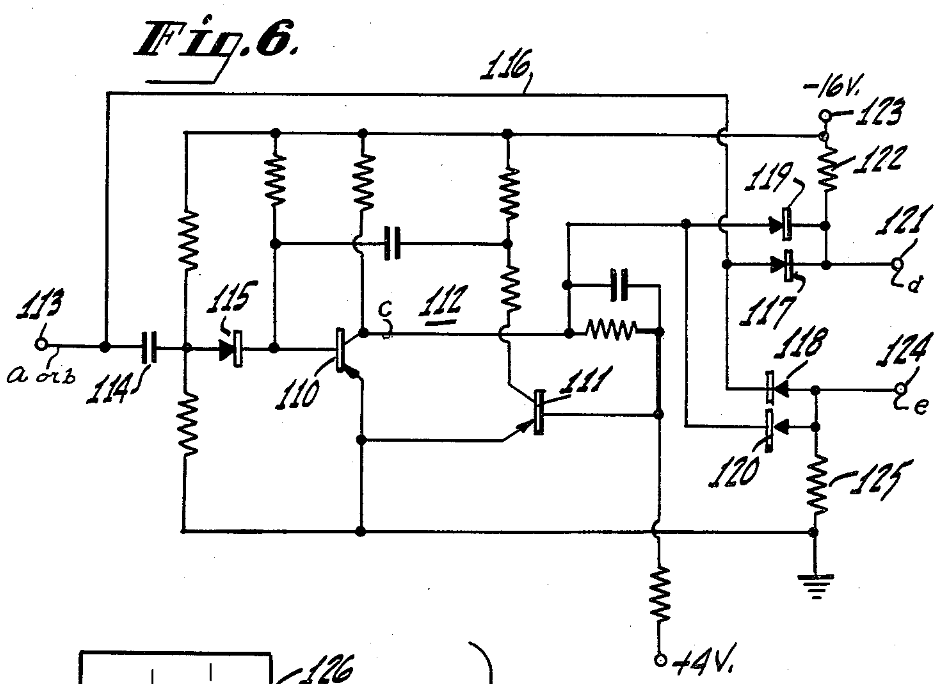
FIGURE 6 is a circuit diagram of a still further embodiment of the invention.
Figure 7:
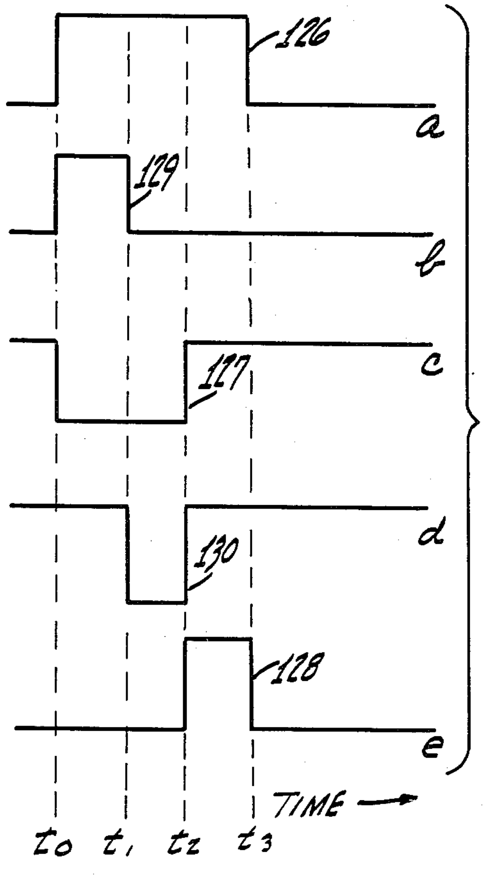
FIGURE 7 is a group of waveforms used in describing the operation of the embodiment illustrated in FIGURE 6.

A simple embodiment of the invention is shown in FIGURE 6. The operation of the embodiment shown in FIGURE 6 is depicted in the waveforms of FIGURE 7. The electrodes of a pair of junction transistors 110, 111 are interconnected to form a monostable multivibrator, indicated generally by the reference numeral 112. The multivibrator 112 of FIGURE 6 is similar in construction and in operation to the multivibrator 30 of FIGURE 1. Input pulses of varying time duration or length are applied to the base electrode of transistor 110 via the inputs terminal 113, capacitor 114 and diode 115.

The pulses received at terminal 113 are simultaneously applied over a lead 116 to the plate electrode of a unidirectional current conducting device shown as a crystal diode 117 and to the cathode electrode of a further unidirectional current conducting device shown as a crystal diode 118. The collector electrode of the transistor 110 is coupled to the plate electrode of a unidirectional current conducting device shown as a crystal diode 119 and to the cathode electrode of a further unidirectional current conducting device shown as a crystal diode 120. The direction of the arrow indicates the direction of current flow through the respective diodes 115, 117, 118, 119 and 120. The cathode electrodes of diodes 117, 119 are both coupled to an output terminal 121 and through a resistor 122 to the negative terminal 123 of a source of unidirectional potential. The plate or anode electrodes of diodes 118, 120 are both coupled to an output terminal 124 and through a resistor 125 to a point of reference potential shown as ground. Diodes 117 and 119 form an AND gating circuit, and diodes 118 and 120 form a further AND gating circuit.

It will be assumed that multivibrator 112 has an unstable period of state of a time duration $t_0$–$t_2$ (FIGURE 7). When a positive going input pulse 126 of time duration $t_0$–$t_3$, shown in waveform *a* of FIGURE 7, is received at terminal 113, multivibrator 112 assumes its active or unstable state. A negative going pulse 127, shown in waveform C of FIGURE 7, appears at the collector electrode of transistor 110. For the period $t_0$–$t_2$, a positive going pulse is applied to the plate electrode of diode 117 and to the cathode electrode of diode 118. A negative going pulse is applied to the plate of diode 119 and to the cathode of diode 120. Diodes 117 and 120 are conducting, and no output pulse appears at terminals 121 or 124. At time $t_2$, multivibrator 112 returns to its stable or inactive state. A positive going voltage now appears at the plate electrode of diode 119 and the cathode electrode of diode 120. For the period $t_2$–$t_3$, diodes 117 and 119 are conducting, and diodes 118 and 120 are non-conducting. A positive going pulse 128 of a duration $t_2$–$t_3$, shown in waveform *e* of FIGURE 7, appears at terminal 124. No output pulse appears at terminal 121.

When a positive going input pulse 129 of duration $t_0$–$t_1$, shown in waveform *b* of FIGURE 7, is applied to terminal 113, multivibrator 112 again assumes its unstable state and the negative going pulse 127 appears at the collector electrode of transistor 110. For the period $t_0$–$t_1$, a positive going pulse is applied to the plate electrode of diode 117 and to the cathode electrode of diode 118. A negative going pulse is applied to the plate electrode of diode 119 and to the cathode electrode of diode 120. Diodes 117 and 120 are conducting, and diodes 119 and 118 are non-conducting. At time $t_1$, the trailing edge of input pulse 129 causes the voltage applied to the plate of diode 117 and to the cathode of diode 118 to become negative going. For the period $t_1$–$t_2$, diodes 119, 117 are non-conducting, and diodes 118 and 120 are conducting. A negative going output pulse 130 of duration $t_1$–$t_2$, shown in waveform *d* of FIGURE 7, appears at terminal 121. No output pulse appears at terminal 124.

Diodes 117, 119 form an AND gating circuit which produces an output pulse at terminal 121 when the respective inputs to the plate or anode electrodes thereof are both negative going, causing the diodes 117, 119 to be non-conductive. Diodes 118, 120 form a further AND gating circuit which produces an output pulse at terminal 124 when the respective inputs to the cathode electrodes thereof are both positive going so that diodes 118, 120 are non-conductive. An output pulse is produced at terminal 124 for each input pulse applied to terminal 113 of a duration greater than the unstable period of multivibrator 112 or $t_0$–$t_2$. The output pulse so produced is of a length corresponding to the amount by which the input pulse length exceeds the unstable period of multivibrator 112. An output pulse is produced at terminal 121 for each input pulse of a duration less than the unstable period of multivibrator 112. The output pulses are of a length corresponding to the amount by which the unstable period of multivibrator 112 exceeds in time the trailing edge of the input pulse. The output pulses at terminals 121 and 124 are in synchronism with the corresponding input pulses.

What is claimed is:

1. A pulse length discriminator comprising, in combination, an input circuit adapted to receive input pulses of different lengths, a first gating circuit coupled to said input circuit, a second gating circuit coupled to said input circuit, and means coupled to said input circuit and over different paths to said first and said second gating circuits for causing said first gating circuit to produce an output pulse only for each of said input pulses of a length greater than a predetermined length and said second gating circuit to produce an output pulse only for each of said input pulses of a length less than said predetermined length.

2. A pulse length discriminator comprising, in combination, an input circuit for receiving input pulses of different lengths, a monostable multivibrator including first and second current conducting devices, means coupling an input of said multivibrator to said input circuit, a first gating circuit having a first input coupled to said input circuit and a second input coupled to an output of one of said devices, and a second gating circuit having a first input coupled to said input circuit and a second input coupled to an output of the other one of said devices.

3. A pulse length discriminator for pulses of different lengths comprising, in combination, a monostable multivibrator including first and second transistor devices, a first transistor gating circuit having an input coupled to an output of said multivibrator, a second transistor gating circuit having an input coupled to a second output of said multivibrator, and means to apply said pulses of different lengths to a second input of said first and said second gating circuits and to apply said pulses as trigger pulses to said multivibrator.

4. A pulse length discriminator comprising, in combination, an input circuit adapted to receive a train of input pulses of different lengths, a monostable multivibrator, means coupling an input of said multivibrator to said input circuit, said multivibrator being arranged to assume its unstable state of given duration in response to and at the time of the leading edge of each input pulse applied thereto, a first gating circuit coupled to said input circuit and to one side of said multivibrator and arranged to provide an output pulse for each input pulse of a length greater than said given duration of the unstable state of said multivibrator, and a second gating circuit coupled to said input circuit and to the other side of said multivibrator and arranged to provide an output pulse for each input pulse of a length less than said given duration of the unstable state of said multivibrator.

5. A pulse length discriminator comprising, in combination, a multivibrator of the type having a stable state and an unstable state of given duration, a source of input pulses of different lengths, means for applying said input pulses from said source to said multivibrator, said multivibrator being arranged to assume its unstable state in response to and at the time of each input pulse from said source, a first gating circuit coupled to said source and to one side of said multivibrator and arranged to provide an output pulse only when an input pulse from said source is of a length greater than said given duration of the unstable state of said multivibrator, and a second gating circuit coupled to said source and to the other side of said multivibrator and arranged to provide an output pulse only when an input pulse from said source is of a length less than said given duration of the unstable state of said multivibrator, the output pulses produced by said first and said second gating circuits each being in synchronism with the trailing edge of the input pulse in response to which the output pulse is provided.

6. A pulse length discriminator comprising, in combination, a timing device of the type having a stable state and an unstable state of given duration, said device when in said stable state providing a signal condition at a first output which is in a direction of polarity opposite to that of a signal condition provided thereby at a second output thereof, the direction of the polarity of the signal conditions at said first and second outputs being reversed when said device is in said unstable state, a source of input pulses of different lengths, means for applying said input pulses from said source to said device, said device being arranged to assume its unstable state in response to and at the time of the leading edge of each input pulse applied thereto, a first gating circuit coupled to said source and to said first output of said device and arranged to produce an output pulse only when an input pulse from said source is of a length greater than said given duration of the unstable state of said device, and a second gating circuit coupled to said source and to said second output of said device and arranged to produce an output pulse only when an input pulse from said source is of a length less than said given duration of the unstable state of said device.

7. A pulse length discriminator comprising, in combination, a monostable multivibrator including first and second current conducting devices interconnected so that said multivibrator has a stable state and an unstable state of given duration, means to apply a train of input pulses of different lengths to said multivibrator, said multivibrator being arranged to assume its unstable state in response to and at the time of the leading edge of each input pulse from said source, a first gating circuit having an input coupled to an output electrode of one of said devices, means to apply said train of input pulses to a second input of said first gating circuit, said first gating circuit being responsive to the inputs thereto to provide an output pulse only when an input pulse applied thereto is of a length greater than said given duration of the unstable period of said multivibrator, a second gating circuit having an input coupled to an output electrode of the other one of said devices, and means to apply said train of input pulses to a second input of said second gating circuit, said second gating circuit being arranged to provide an output pulse only when an input pulse applied thereto is of a length less than said given duration of the unstable state of said multivibrator.

8. A pulse length discriminator comprising, in combination, an input circuit to which input pulses of different lengths and of the same polarity are applied, a monostable multivibrator including first and second current conducting devices interconnected so that said multivibrator has a stable state and an unstable state of given duration less than the spacing between said input pulses, said multivibrator being arranged to provide at the output electrode of one of said devices a signal condition having a direction of polarity opposite to that of a signal condition provided at the output electrode of the other one of said devices, the direction of polarity of said signal conditions being reversed upon said multivibrator assuming its unstable state, means to apply said input pulses from said input circuit to said multivibrator, said multivibrator being arranged to assume its unstable state in response to and at the time of the leading edge of each input pulse applied thereto, a first gating circuit having one input coupled to said input circuit and a second input coupled to the output electrode of one of said devices, said first gating circuit being arranged to provide an output pulse only for each input pulse from said input circuit having a length greater than said given duration of the unstable state of said multivibrator, and a second gating circuit having one input coupled to said input circuit and a second input coupled to the output electrode of the other one of said devices, said second gating circuit being arranged to provide an output pulse only for each input pulse from said input circuit having a length less than said given duration of the unstable state of said multivibrator.

9. A pulse length discriminator comprising, in combination, an input circuit to which input pulses of different length and of the same polarity are applied, a monostable multivibrator including first and second current conducting devices interconnected so that said multivibrator has a stable state and an unstable state of given duration less than the spacing between said input pulses, said multivibrator being arranged to provide at the output electrode of one of said devices a signal condition having a direction of polarity opposite to that of a signal condition provided at the output electrode of the other one of said devices, the direction of polarity of said signal conditions being reversed upon said multivibrator assuming its unstable state, means to apply said input pulses from said input circuit to said multivibrator, said multivibrator being arranged to assume its unstable state in response to and at the time of the leading edge of each input pulse applied thereto, a first gating circuit having one input coupled to said input circuit and a second input coupled to the output electrode of one of said devices, means to bias said first gating circuit to produce therefrom an output pulse only when an input pulse from said input circuit is of a length greater than said given duration of the unstable state of said multivibrator, a second gating circuit having one input coupled to said input circuit and a second input coupled to the output electrode of the other one of said devices, and means to bias said second gating circuit to produce therefrom an output pulse only when an input pulse from said input circuit is of a length less than said given duration of the unstable state of said multivibrator.

10. A pulse length discriminator comprising, in combination, an input circuit adapted to receive input pulses of different lengths and of the same polarity, first and second transistor devices each having input, output and control electrodes, means to couple the input electrode of said first device to said input circuit, means to interconnect the input, output and control electrodes of said first device with the electrodes of said second device to form a monostable multivibrator having a stable state in which said first device is conducting and said second device is non-conducting, said multivibrator being arranged to assume at the time of the leading edge of each input pulse applied to the input electrode of said first device an unstable state of a given duration less than the spacing between said input pulses in which said first device is non-conducting and said second device is conducting, third and fourth transistor devices each having input, output and control electrodes, means to couple the input electrode of said third device to said input circuit and to the output electrode of said first device, means to bias the electrodes of said third device to cause said third device to provide an output pulse only when an input pulse from said input circuit is of a length greater than said given duration of the unstable state of said multivibrator, means to couple the input electrode of said fourth device to said input circuit and to the output electrode of said second device, means to bias the electrodes of said fourth device to cause said fourth device to provide an output pulse only when an input pulse from said input circuit is of a length less than said given duration of the unstable state of said multivibrator, both said third and said fourth devices being operated to produce output pulses which are each in synchronism with the trailing edge of and of a length determined by the input pulse in response to which the output pulse is provided.

11. A pulse length discriminator as claimed in claim 10 and wherein said input circuit includes an on-off trigger circuit of the type which switches from one stable state to a second stable state for the period in which a signal applied thereto rises above a given level, means to apply a signal having said periods corresponding to input pulses of different lengths to said trigger circuit, and means for applying the output pulses produced by said trigger circuit in response to said signal to the input electrodes of said first, third and fourth devices in push-pull.

12. A pulse length discriminator comprising, in combination, an input circuit adapted to receive input pulses of different lengths, a first gating circuit having an input coupled to said input circuit, a second gating circuit having an input coupled to said input circuit, a monostable multivibrator coupled between said input circuit and a second input of said first and said second gating circuits, a third gating circuit having an input coupled to said input circuit, a fourth gating circuit having an input coupled to the output of said second gating circuit, and a second monostable multivibrator coupled between the output of said second gating circuit and a second input of said third and said fourth gating circuits.

13. A pulse length discriminator comprising, in combination, an input circuit adapted to receive input pulses of different lengths and of the same polarity, a monostable multivibrator coupled to said input circuit and having a stable state and an unstable state of a given duration less than the spacing between said input pulses, said multivibrator being switched from its stable state in which said multivibrator provides first and second outputs of relatively opposite polarity to its unstable state in which said first and second outputs are each reversed in polarity in response to and at the time of the leading edge of each input pulse applied thereto, a first gating circuit coupled to said input circuit and to said first output and arranged to provide an output pulse only for each input pulse from said input circuit of a length less than said given duration of the unstable state of said multivibrator, a second gating circuit coupled to said input circuit and to said second output and arranged to provide an output pulse only for each input pulse from said input circuit of a length greater than said given duration of the unstable state of said multivibrator, a second monostable multivibrator coupled to the output of said second gating circuit and having a stable state and an unstable state of said given duration, said second multivibrator being switched from its stable state in which said second multivibrator provides third and fourth outputs of relatively opposite polarity to its unstable state in which said third and fourth outputs are each reversed in polarity in response to and at the time of the leading edge of an output pulse from said second gating circuit, a third gating circuit coupled to said input circuit and to said third output of said second multivibrator and arranged to provide an output pulse only for each input pulse from said input circuit of a length greater than said given duration of the unstable state of said first multivibrator but less than twice said given duration, and a fourth gating circuit coupled to said output of said second gating circuit and to said fourth output and arranged to provide an output pulse only for each of said input pulses of a length greater than twice said given duration, said first, third and fourth gating circuits being operated to provide said output pulses each in synchronism with the trailing edge of, and having a length determined by, the input pulse in response to which the output pulse is provided.

14. In combination, an input circuit adapted to receive input pulses of different lengths, first, second, third and fourth unidirectional current conducting devices each having a plate and a cathode electrode, a monostable multivibrator having an input coupled to said input circuit and an output coupled to the plate electrode of said first device and to the cathode electrode of said second device, said multivibrator being arranged to assume its unstable state in response to and at the time of the leading edge of each said input pulse for a time period greater than the period of the shortest one of said input pulses but less than the period of the longest one of said input pulses, means to couple said input circuit to the plate electrode of said third device and to the cathode electrode of said fourth device, a first output means coupled to the cathode electrodes of said first and third devices for producing an output pulse when the inputs to the plate electrodes of said first and third devices are both of a negative going polarity, and a second output means coupled to the plate electrodes of said second and fourth devices for producing an output pulse when the inputs to the cathode electrodes of said second and fourth devices are both of a positive going polarity.

15. In a combination as claimed in claim 14, said first output means including a resistor coupled between the negative terminal of a source of unidirectional potential and the cathode electrodes of said first and third devices with an output terminal coupled to the junction of said resistor and said last-mentioned cathode electrodes, said second output means including a second resistor coupled between the plate electrodes of said second and fourth devices and a point of reference potential with an output terminal coupled to the junction of said second resistor and said last-mentioned plate electrodes.

References Cited in the file of this patent

UNITED STATES PATENTS

| | | |
|---|---|---|
| 2,564,692 | Hoeppner | Aug. 21, 1951 |
| 2,700,149 | Stone | Jan. 18, 1955 |
| 2,856,525 | Lubkin | Oct. 14, 1958 |
| 2,947,945 | Relis et al. | Aug. 2, 1960 |